United States Patent [19]

Bloch et al.

[11] Patent Number: 4,683,160
[45] Date of Patent: Jul. 28, 1987

[54] SOLAR CELLS WITH CORRELATED ROUGHNESS SUBSTRATE

[75] Inventors: Aaron N. Bloch, Bridgewater; Ping Sheng, Skillman, both of N.J.

[73] Assignee: Exxon Research and Engineering Company, Florham Park, N.J.

[21] Appl. No.: 732,145

[22] Filed: May 9, 1985

[51] Int. Cl.⁴ ............... B32B 3/30; H01L 31/00
[52] U.S. Cl. .................... 428/141; 136/258; 136/261; 428/156; 428/220; 428/446; 428/688
[58] Field of Search ........... 428/156, 220, 446, 688, 428/141; 136/258 AM, 261

[56] References Cited

U.S. PATENT DOCUMENTS 4,398,056 8/1983 Shen .................. 136/258 AM
4,493,942 1/1985 Sheng et al. ........ 136/258 AM
4,514,582 4/1985 Tiedje et al. ....... 136/258 AM Primary Examiner—Paul J. Thibodeau
Attorney, Agent, or Firm—Ronald D. Hantman

[57] ABSTRACT

A thin film photoconductive device with a substrate structure of "correlated roughness" is disclosed for enhancing the absorption of solar light.

6 Claims, 3 Drawing Figures

SOLAR CELLS WITH CORRELATED ROUGHNESS SUBSTRATE

BACKGROUND OF THE INVENTION

The present invention relates to photoconductive devices which absorb incident light. In particular, the present invention relates to solar cells in which light absorption is optimized by means of a rough surface whose geometry is correlated to the incident light.

Many of the materials used for solar cells, such as silicon, require a thick active layer because of low absorption of incident light. In particular, silicon has low solar absorptance in the infrared and far-infrared. It is, however, desirable to reduce the thickness of the active material for several reasons. First, a thin layer would reduce the amount and, therefore, the cost of the active material. Second, a thin layer would allow for a reduction in the diffusion length of the generated carriers. Shorter diffusion lengths allow for a reduction in the purity of the active material.

It is known that the optical absorption and, hence, the efficiency in the thin film solar cells is enhanced by texturing. Light scattered from a randomly textured surface (or surfaces) can be trapped in the active layer of the cell by internal reflection. The amount of light trapped depends upon the details of the texturing, see e.g., E. Yablonovitch and G. Cody, IEEE Transactions on Electron Devices ED 300, 1982.

Another way to increase the efficiency of thin-film solar cells is by using a grating substrate, see, e.g., U.S. Pat. No. 4,493,942 and U.S. Pat. No. 4,398,056. Such a device relies on the existence of guided modes in thin films, and the use of a grating to couple the incident light into these guided modes. This can result in extremely strong enhancement for absorption of light of a given frequency at a given angle of incidence. In other words, the diffraction grating is a strongly tuned device. For practical solar cells however, one is interested in a range of frequencies, determined by the solar spectrum and the absorption spectrum of the semiconductor, and in a range of incident angles, determined by the motion of the sun over the sky in the course of the day. Only a small fraction of this range can take advantage of the fine tuned grating.

The present invention is a new class of structures, denoted as "correlated roughness" structures, which combine both random and guide mode structures in order to optimize the coupling to externally incident sunlight over the relevant range of frequencies and angles.

For a given grating configuration, there can be only a discrete number of incident angles at which the coupling of the incident light with the guided modes is locally optimal. If the incident light were to deviate slightly from these optimal angles, the grating would have to be varied in order to maintain the optimal coupling. If one demands that a single structure maintain the most effective possible coupling as the incident angle were varied, such a structure could not be a grating, since a grating requires perfect periodicity. Rather, the structure which would maintain optimal coupling averaged over angles can be visualized as a weighted superposition of gratings of periodicity appropriate for each angle of interest. Such a structure is not completely random, since locally there is still a significant amount of ordering. Yet over a large enough distance the randomness is apparent.

SUMMARY OF THE INVENTION

The present invention is a photoconductive device which includes an active layer of semiconductor material wherein one of the surfaces of the active layer is textured with microstructures, the microstructues corresponding to the Fourier transform of the structure factor S(k), where S(k) has been chosen to maximize $$\int_{\omega_-}^{\omega_+} F(\omega_k) d\omega_k$$

where $$F(\omega_k) = I(\omega_k) A(\omega_k) |S(k)|^2 N(\omega_k)$$

$F(\omega_k)$ = absorbed light intensity;
$I(\omega_k)$ = intensity of incident light;
$A(\omega_k)$ = absorption of light by the semiconductor;
$N(\omega_k)$ = density of guided modestate;
$\omega_k$ = frequency of guided mode of wave vector k;
$W_-$, $\omega_{30}$ = limits of the frequency range of interest.

DESCRIPTION OF THE PREFERRED EMBODIMENT

As described above, the present invention is a photoconductive device whose active material is a thin film wherein one of the surfaces of the film is textured with microstructures to increase the light absorption within the film of the incident light. The microstructures of the device are described below.

The enhancement of light absorption in a thin film photoconductor at any frequency and angle of incidence is proportional to the product $$F(\omega_k) = I(\omega_k) A(\omega_k) |S(k)|^2 N(\omega_k). \tag{1}$$

Here $\omega_k$ is the frequency of a guided mode of wave vector k, $I(\omega_k)$ is the intensity sunlight, $A(\omega_k)$ is the absorption by the semiconductor, $N(\omega_k)$ is the density of guided mode states, and S(k) is the structure factor of the microstructured surface.

Figure 1:
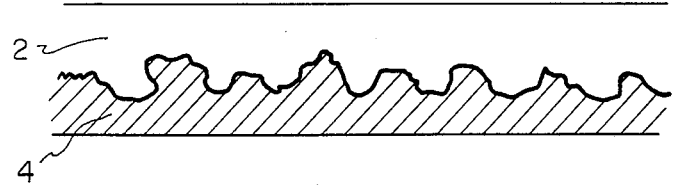
FIG. 1 shows a schematic cross section of a device constructed according to the present invention.

As an illustration, consider the structure shown schematically in FIG. 1. Layer 2 is a semiconductor photoconductive material. This layer is fixed to a substrate 4 which includes the microstructures referred to above.

The cross-sectional profile of the device is illustrated schematically in FIG. 1.

If the deviation of the height from its average at point x is h(x), then for each wave vector k the structure factor S(k) is defined as the Fourier transform $$S(k) = \int_{-\infty}^{\infty} dx \int_{-\infty}^{\infty} dx' h(x) h(x - x') e^{ikx'}$$

Figure 2A:
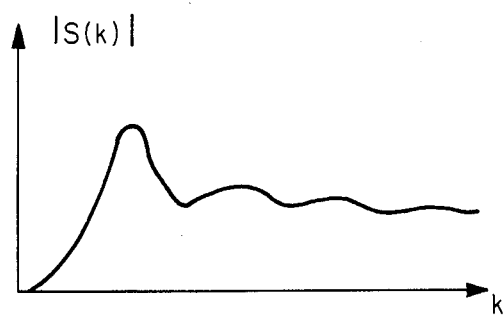
FIG. 2(a) shows a schematic diagram of the structure factor of the device of FIG. 1.
Figure 2B:
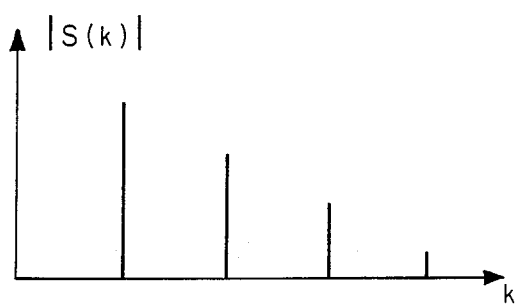
FIG. 2(b) shows a schematic diagram of the structure factor for a periodic diffraction grating.

For a structure such as that of FIG. 1, the absolute magnitude of S(k), |S(k)|, would resemble FIG. 2(a). In contrast, the structure factor for a simple grating is illustrated in FIG. 2(b), see, e.g., D. Sherwood, "Crystals, X-rays and Proteins", Halsted Press. Insofar as the simple periodic grating is analogous to a two-dimensional crystal, the correlated roughness can be thought of as a sum of many figures like 2(b), each with a different spacing and with amplitude weighted according to the importance of that spacing to the diffraction problem at hand. In this way the correlated roughness would provide the less angle-dependent coupling that we seek, since S(k) can be chosen so that at each incident angle there is an "effective grating" with the right parameters for optimal coupling.

The product $I(\omega_k)A(\omega_k)$ is a peaked function of finite width. It follows that $|S(k)|^2$ can be chosen so as to maximize the function $F(\omega_k)$ averaged over this width and over the values of k corresponding to the appropriate angles of incidence. For each value of k the appropriate value of $|S(k)|^2$ is given by:

$$|S(k)|^2 = \int d\theta \sin\theta \cos\theta \sum_{m=1}^{m_{max}} I[\omega_k(m,\theta)] A[\omega_k(m,\theta)]k \left(\frac{dk}{d\omega}\right)_{m,\theta} \quad (2)$$

where $\omega_k$ is the angular frequency of the mth guided mode in a film of thickness D, $\theta$ is the angle of incidence of the light measured from vertical, and $m_{max}$ is the total number of allowed guided modes in the film. For a discussion of guided modes and waveguides, see, for example, "Theory of Dielectric Optical Wavegudes" by D. Marcuse, Academic Press (1974).

As an example, consider the case of an amorphous silicon solar cell with D=0.5 µm. In this case, significant enhancement of absorption can occur over the wavelength range $\lambda_{31}$=0.6 mµ to $\lambda_+$ =0.8 µm. We will denote the middle of the range by $\lambda_o$=0.7 µm. The range corresponds to a maximum and a minimum value of k, given by $$k_{min} = 2\pi \sqrt{\left(\frac{n_{Si}}{\lambda_+}\right)^2 - \left(\frac{m_{max}}{2D}\right)^2},$$

$$k_{max} = 2\pi \sqrt{\left(\frac{n_{Si}}{\lambda_-}\right)^2 - \left(\frac{1}{2D}\right)^2},$$

and a central value $$k_o = 2\pi \sqrt{\left(\frac{n_{Si}}{\lambda_o}\right)^2 - \left(\frac{\overline{m}}{2D}\right)^2}$$

where $\overline{m}$=3, $m_{max}$=4, and $n_{Si}$ is the index of refraction of amorphous silicon (~3.5) in this wavelength range.

An approximate way of creating a structure whose S(k) is peaked about $k_o$ with peak half-width $k_{max}-k_{min}$ can be accomplished by using an aggregation of bright metallic grains or spheres, grouped into sets whose respective mean diameters vary by small increments from $d_{min}=\pi/k_{max}$=0.17 µm to $d_{max}=2\pi/k_{min}$=0.57 µm. The incremental step size must be small enough so as to get a sufficient number of intervals so as to get a good approximation to the continuous curve S(k). A suitable size would be about 0.05 µm or less. A preferred range is between 0.025 µm and 0.05 µm, although spheres as small as 0.005 µm have been made. Of these a random mixture should be formed such that the number of grains N(d) in the mixture from the set with diameter d is related to the number $N(d_o)$ from the set with diameter $d_o=2\pi/k_o$=0.25 µm by:

$$\frac{N(d)}{N(d_o)} = \frac{|S(k)|^2}{|S(k_o)|^2} \quad (3)$$

where K=2π/d and S(k) is given by Equation (2). A monolayer of this mixture on an adhesive substrate will form the correlated roughness structure, which can be used as a backing for a thin-film silicon solar cell.

Alternately, the spheres can be used as a lithographic mask on a substrate after which the pattern can be transferred to the substrate by a suitable etching process, see U.S. Pat. No. 4,407,695.

What is claimed is:

1. A photoconductive device comprising an active layer of semiconductor material having a pair of opposed surfaces,
one of said surfaces of said active layer textured with microstructures, said microstructures corresponding to the Fourier transform of the structure factor S(k), where S(k) has been chosen to maximize $$\int_{\omega_-}^{\omega_+} F(\omega_k) d\omega_k$$

where $$F(\omega_k) = I(\omega_k) A(\omega_k) S(k) N(\omega_k)$$

$F(\omega_k)$=absorbed light intensity;
$I(\omega_k)$=intensity of incident light;
$A(\omega_k)$=absorption of light by the semiconductor;
$N(\omega_k)$=density of guided mode state;
$\omega_k$=frequency of guided mode of wave-vector k;
$\omega_{31}$, $\omega_+$ =limits of the frequency range of interest.

2. The photoconductive device of claim 1 wherein said structure factor S(k) is given by $$|S(k)|^2 = \int d\theta \sin\theta \cos\theta \sum_{m=1}^{m_{max}} I[\omega_k(m,\theta)] A[\omega_k(m,\theta)]k \left(\frac{dk}{d\omega}\right)_{m,\theta}$$

where
$\omega_k(m, \theta)$=angular frequency of $m^{th}$ guided mode;
$\theta$=angle of incidence of light measured from the vertical;
$m_{max}$=total number of allowed guided modes in the semiconductor layer.

3. The photoconductive device of claim 2 wherein said microstructures have mean diameters which increase in preselected increments between $d_{min}=2\pi/k_{max}$ and $d_{max}=2\pi/k_{min}$ where $k_{max}-k_{min}$ is the half width of S(k) centered about its peak value of $k_o$ where S(k) has been evaluated for a preselected material and wavelength range, wherein the number of microstructures N(d) with mean diameter d is selected to the number of microstructures $N(d_o)$ with mean diameter, $d_o$, by $$\frac{N(d)}{N(d_o)} = \frac{|S(k)|^2}{|S(k_o)|^2}$$

4. The photoconductive device of claim 3 wherein said semiconductor material is amorphous silicon.

5. The photoconductive device of claim 4 wherein said layer of amorphous silicon has a thickness of 0.5 μm and said S(k) is evaluated between the wavelength range $\lambda_- = 0.6$ μm and $\lambda_+ = 0.08$ μm.

6. The photoconductive device of claim 5 wherein the preseleced increment in the increase in mean diameter of said microstructures is between 0.05 μm and 0.025 μm.

* * * * *